United States Patent [19]

Yu et al.

[11] Patent Number: 5,094,977
[45] Date of Patent: Mar. 10, 1992

[54] STRESS REDUCTION IN METAL FILMS BY LASER ANNEALING

[75] Inventors: Chang Yu; Trung T. Doan; Gurtej S. Sandhu, all of Boise, Id.

[73] Assignee: Micron Technology, Inc., Boise, Id.

[21] Appl. No.: 645,865

[22] Filed: Jan. 25, 1991

[51] Int. Cl.$^5$ .................. H01L 21/268; H01L 21/428
[52] U.S. Cl. ........................ 437/174; 148/DIG. 90; 148/DIG. 93; 427/53.1; 427/124; 437/173; 437/246
[58] Field of Search ............... 437/173, 174, 245, 246; 148/DIG. 90, DIG. 93; 427/124, 53.1

[56] References Cited

U.S. PATENT DOCUMENTS

| | | | |
|---|---|---|---|
| 4,439,245 | 3/1984 | Wu | 437/174 |
| 4,751,197 | 6/1988 | Wills | 437/174 |
| 5,032,233 | 7/1991 | Yu et al. | 204/192.28 |

FOREIGN PATENT DOCUMENTS

| | | | |
|---|---|---|---|
| 0021209 | 1/1987 | Japan | 437/174 |
| 0145832 | 6/1989 | Japan | 437/174 |

OTHER PUBLICATIONS

McGonigal et al., "Improvements in Aluminum-Silicon Schottky Barriers Due to Processing with a Pulsed Ruby Laser", IEEE Letters, vol. EDL-2, No. 6, 6/81, pp. 149-151.

Davies et al., "Two-Channel Optical Pyrometry of Metals Irradiated by Picosecond Laser Pulses", J. Appl. Phys., 66(7), Oct. 1, 1989, pp. 3293-3297.

*Primary Examiner*—Olik Chaudhuri
*Assistant Examiner*—Ken Horton
*Attorney, Agent, or Firm*—Wells, St. John & Roberts

[57] ABSTRACT

A method of processing a semiconductor wafer comprises, a) chemical vapor depositing (CVD) a metal layer atop a semiconductor substrate; and b) impinging laser energy upon the CVD metal layer at an optical fluence of from 0.05 Joules/cm$^2$ to 0.30 Joules/cm$^2$ for a period of time sufficient to relieve mechanical stress associated with the CVD metal layer yet insufficient to melt the CVD metal layer. In accordance with another aspect of the invention, such treatment method could also be used to form a desired silicide layer in the same step.

14 Claims, No Drawings

STRESS REDUCTION IN METAL FILMS BY LASER ANNEALING

TECHNICAL FIELD

This invention relates generally to mechanical stress reduction associated with metal films applied atop semiconductor wafers.

BACKGROUND OF THE INVENTION

Integrated circuits are chemically and physically integrated into a substrate, such as a silcon wafer, by patterning regions in the substrate, and by patterning layers on the substrate. Deposited conductors are an integral part of every integrated circuit, and provide the role of interlevel and surface wiring for conducting electrical current. Specifically, the deposited conductors are used to wire together the various components that are formed within the wafer. Such conductors are commonly known as "lines" or "runners". Conductors also provide other functions in integrated circuit structures, such as fuses and back side electrical contacts for the packaged die.

Common materials for forming conductive lines or runners are elemental metals and metal alloys. Metal material would be applied atop the wafer, by techniques such as sputtering or chemical vapor deposition, and thereafter photomasked and etched to produce the desired construction. Unfortunately, many metals do not have the same expansion/contraction properties (for example, thermal expansion coefficient) of the underlying substrate, which is predominantly either silicon or silicon oxides.

Internal and external mechanical stresses are associated with applied metal films. Internal mechanical stresses are inherent in any applied solid material and relate to stress which develops upon temperature change of a material which leads to expansion or contraction. External stresses result from the difference in expansion properties of two adjacent materials which form an adhesive bond relative to one another. Any relief of such mechanical stresses is desirable to minimize any tendency of separation between layers or fracture. High stress in metal films is particularly a problem with chemical vapor deposited tungsten and titanium nitride films in current metalization semiconductor processing technology.

Internal metal film stress is typically not of significant concern with respect to sputtered metal films. Sputtered metal films inherently exhibit poor step coverage over the varying typography on a semiconductor wafer. To alleviate this, sputtered metal films are melted causing reflow of the material to produce adequate step coverage. The step of melting and completely filling the valleys on the wafer is known within the art to result in an inherent relieving of internal mechanical stresses which exist in the as-deposited sputtered film.

On the other hand, chemical vapor deposited films exhibit excellent step coverage, requiring no subsequent melting or reflow. High temperature furnace annealing has shown promise in reducing internal and/or external stresses associated with chemical vapor deposited metal films. For example, treatment of chemical vapor deposited tungsten above 700° C. has shown an ability to reduce the magnitude of the inherent stress, particularly tensile stress, and also to change the sign of the particular stress from compressive to tensile or vice versa. Thus, film stress in metal layers can apparently be reduced by proper high temperature annealing.

This invention concerns alternate methods of reducing mechanical stress in chemical vapor deposited metal films.

DETAILED DESCRIPTION OF THE PREFERRED EMBODIMENTS

The following disclosure of the invention is submitted in furtherance with the constitutional purpose of the U.S. Patent Laws "to promote the progress of science and useful arts" (Article 1, Section 8).

In accordance with the invention, a method of processing a semiconductor wafer comprises the following steps:
  chemical vapor depositing (CVD) a metal layer atop a semiconductor substrate; and
  impinging laser energy in the form of a laser beam upon the CVD metal layer at an application rate (optical fluence) of from 0.05 Joules/cm$^2$ to 0.30 Joules/cm$^2$ for a period of time sufficient to relieve mechanical stress associated with the CVD metal layer, yet insufficient to melt the CVD metal layer.

Preferably the semiconductor substrate is heated to an elevated temperature, such as between 200° C. to 500° C., prior to impinging laser energy upon the CVD layer, and such elevated temperature is preferably maintained during treatment. Elevating the temperature in this manner is believed to minimize the amount of laser energy required to impart the stress reducing effect. Alternately, elevating the substrate temperature can be considered as enhancing the efficiency of laser energy transfer to the substrate to impart the stress reducing effect. For example, for a given time period of actual laser beam application to the substrate, greater stress reduction should result where the wafer has been preheated to between 200° C. and 500° C. and maintained during treatment than where there has been no preheating of the wafer prior to treatment. The invention is expected to have its most significant effects in mechanical stress reduction of tungsten and titanium nitride films which typically exhibit troublesome mechanical stress as applied to silicon substrate wafers.

In accordance with another aspect of the invention, such treatment method could also be used to form a desired silicide layer in the same step. Typical electrical interconnecting metalization employs several layers for different purposes. An example first layer atop an active area for electrical interconnect contact would be formation of a very thin layer of silicide. Silicides are formed to reduce contact resistance and increase device speed. The silicide layer is typically formed by first applying a very thin film of metal atop the wafer which will be used to form the silicide with the predominantly silicon substrate. Thereafter, the substrate is heated to cause a reaction between the metal and substrate to form the metal silicide.

A next metal layer is a barrier metal, which is typically applied atop the silicide layer. The barrier layer prevents or at least retards two materials on opposite sides of the barrier layer from diffusing into one another. This normally leads to better junction integrity. The much thicker interconnect layer is then typically applied atop the barrier layer.

In accordance with this aspect of the invention, a first layer of first metal would be deposited atop a semiconductor substrate for subsequent formation of a silicide with silicon of the underlying substrate. By way of example only, suitable metals for such purpose would include titanium or cobalt. Next, and optionally, a second layer of a second metal could be applied atop the first metal layer for creation of a barrier metal layer. By way of example only, the barrier metal layer could be comprised of a titanium tungsten alloy. Subsequently, a third metal layer, such as tungsten or titanium nitride, would be chemical vapor deposited atop of the second and first metal layers for formation of the electrically conductive interconnecting lines of the circuit.

Next, laser energy would be impinged upon the third CVD metal layer at an optical fluence of from 0.05 Joules/cm$^2$ to 0.30 Joules/cm$^2$ for a period of time sufficient to both, a) relieve mechanical stress associated with the third CVD metal layer, and b) form a silicide layer by reaction of the first metal layer with underlying silicon of the substrate. The energy and period of time of laser application need be insufficient to melt the first, second and third metal layers, which would result in intermixing. With the prior art, the silicide would typically be formed by a separate independent heating step immediately after application of the first metal layer for formation of the silicide. This aspect of the invention would of course have applicability regardless of whether an intervening barrier metal layer was applied or whether the CVD metal was applied directly atop the first metal layer.

The invention was reduced to practice with a 0.7 micron thick CVD tungsten film which had been applied atop a 500 Angstroms titanium nitride/200 Angstroms titanium/silicon substrate wafer. A XeCl excimer laser was employed, with the substrate being preheated to a temperature of 400° C. A pulsed laser beam was applied at a fluence of 0.29 Joules/cm$^2$ for approximately 25 nanoseconds. The as-deposited combined mechanical stress of the 0.7 micron thick CVD tungsten film was measured at $9.60 \times 10^9$ Dynes/cm$^2$. After application of the laser energy, the combined mechanical stress was reduced to $9.35 \times 10^9$ Dynes/cm$^2$. Application of higher laser fluences for time periods insufficient to melt the applied CVD layer and where the substrate was heated at temperatures of 400° C. and below resulted in unexplainable increases in stress as compared to the as-deposited films. From such data, it is postulated that treatments in accordance with the invention with a laser fluence of from 0.05 to 0.30 Joules/cm$^2$ will result in the stress reduction in accordance with the invention.

As compared with furnace annealing, treatments in accordance with the invention have the advantages of better temperature control by an ability to vary the optical fluence, and potentially higher wafer throughput than with furnace annealing. In addition, when silicide formation is desired, the composite can be created and stress reduction and silicide formation can be achieved in a single step.

In compliance with the statute, the invention has been described in language more or less specific as to methodical features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of processing a semiconductor wafer comprising the following steps:
   chemical vapor depositing (CVD) a metal layer atop a semiconductor substrate; and
   impinging laser energy upon the CVD metal layer at an optical fluence of from 0.05 Joules/cm$^2$ to 0.30 Joules/cm$^2$ for a period of time sufficient to relieve mechanical stress associated with the CVD metal layer yet insufficient to melt the CVD metal layer.

2. The method of processing a semiconductor wafer of claim 1 further comprising preheating the semiconductor substrate to an elevated temperature prior to impinging laser energy upon the CVD metal layer, and maintaining the substrate at the elevated temperature during treatment.

3. The method of processing a semiconductor wafer of claim 2 wherein the elevated temperature is from 200° C. to 500° C.

4. The method of processing a semiconductor wafer of claim 2 wherein the elevated temperature is from 300° C. to 400° C.

5. The method of processing a semiconductor wafer of claim 1 wherein the metal of the metal layer is selected from the group consisting of tungsten and titanium nitride.

6. The method of processing a semiconductor wafer of claim 1 wherein the metal of the metal layer is selected from the group consisting of tungsten and titanium nitride, and further comprising:
   preheating the semiconductor substrate to an elevated temperature prior to impinging laser energy upon the CVD metal layer, and maintaining the substrate at the elevated temperature during treatment.

7. The method of processing a semiconductor wafer of claim 6 wherein the elevated temperature is from 200° C. to 500° C.

8. The method of processing a semiconductor wafer of claim 6 wherein the elevated temperature is from 300° C. to 400° C.

9. A method of processing a semiconductor wafer comprising the following steps:
   depositing a first layer of first metal atop a semiconductor substrate for subsequent formation of a silicide with silicon of the substrate;
   chemical vapor depositing (CVD) a another metal layer atop the first metal layer for formation of electrically conductive interconnecting lines; and
   impinging laser energy upon the CVD metal layer at an optical fluence of from 0.05 Joules/cm$^2$ to 0.30 Joules/cm$^2$ for a period of time sufficient to both, a) relieve mechanical stress associated with the CVD metal layer, and b) form a silicide layer by reaction of the first metal layer with underlying silicon of the substrate, the period of time being insufficient to melt the first and CVD metal layers.

10. The method of processing a semiconductor wafer of claim 9 further comprising preheating the semiconductor substrate to an elevated temperature prior to impinging laser energy upon the CVD metal layer.

11. The method of processing a semiconductor wafer of claim 10 wherein the elevated temperature is from 200° C. to 500° C.

12. The method of processing a semiconductor wafer of claim 10 wherein the elevated temperature is from 300° C. to 400° C.

13. The method of processing a semiconductor wafer of claim 9 wherein the CVD metal is selected from the group consisting of tungsten and titanium nitride.

14. A method of processing a semiconductor wafer comprising the following sequential steps:
- depositing a first layer of first metal atop a semiconductor substrate for subsequent formation of a silicide with silicon of the substrate;
- depositing a second layer of second metal atop the first metal layer for formation of a barrier metal layer;
- heating the substrate to a temperature of from 200° C. to 500° C.;
- chemical vapor depositing (CVD) tungsten or titanium nitride atop the second metal layer for formation of electrically conductive interconnecting lines; and
- impinging laser energy upon the tungsten or titanium nitride CVD metal layer at an optical fluence of from 0.05 Joules/cm$^2$ to 0.30 Joules/cm$^2$ for a period of time sufficient to both, a) relieve mechanical stress associated with the tungsten or titanium nitride CVD metal layer, and b) form a silicide layer by reaction of the first metal layer with underlying silicon of the substrate, the period of time being insufficient melt the first, second and CVD metal layers.

* * * * *